US006992527B2

(12) United States Patent
Yokoyama

(10) Patent No.: US 6,992,527 B2
(45) Date of Patent: Jan. 31, 2006

(54) DIGITAL POWER AMPLIFIER

(75) Inventor: Kenji Yokoyama, Tokyo (JP)

(73) Assignee: Flying Mole Corporation, (JP)

( * ) Notice: Subject to any disclaimer, the term of this patent is extended or adjusted under 35 U.S.C. 154(b) by 0 days.

(21) Appl. No.: 10/646,768

(22) Filed: Aug. 25, 2003

(65) Prior Publication Data

US 2004/0041626 A1 Mar. 4, 2004

(30) Foreign Application Priority Data

Aug. 28, 2002 (JP) .............................. 2002-248733

(51) Int. Cl.
*H03F 3/38* (2006.01)
*H03F 3/217* (2006.01)
(52) U.S. Cl. ................. 330/10; 330/207 A; 330/251
(58) Field of Classification Search ................. 330/10, 330/207 A, 251; 363/41; 375/238
See application file for complete search history.

(56) References Cited

U.S. PATENT DOCUMENTS

| 4,724,396 A | 2/1988 | Taylor, Jr. et al. ............. 330/10 |
| 5,117,198 A | 5/1992 | Morenz ....................... 330/251 |
| 5,543,753 A | 8/1996 | Williamson .................. 330/297 |
| 5,657,219 A | 8/1997 | Stanley ........................ 363/132 |
| 6,249,182 B1 * | 6/2001 | Pullen .......................... 330/10 |
| 6,304,137 B1 | 10/2001 | Pullen et al. ................. 330/10 |

FOREIGN PATENT DOCUMENTS

| JP | 57-5087 | 1/1982 |
| JP | 61-212905 | 9/1986 |
| JP | 63-200605 | 8/1988 |
| JP | 7-94963 | 4/1995 |
| JP | 7-231226 | 8/1995 |
| JP | 2002-162985 | 6/2002 |

* cited by examiner

*Primary Examiner*—Khanh V. Nguyen
(74) *Attorney, Agent, or Firm*—Bacon & Thomas

(57) ABSTRACT

A digital power amplifier has first and second switches, between a high potential power line and a low potential power line, which operate complementarily. When switching an ON switch, dead time is provided to control power to a low-pass filter. In a switching section, the first switch, a first coil, a second coil and the second switch are connected in series, between the high and low potential power lines. The switching section includes a first high-speed diode having a cathode connected to the high potential power line and an anode connected to a node between the second coil and the second switch, and a second high-speed, diode having a cathode connected to a node between the first switch and the first coil and an anode connected to the low potential power line. The node between the first coil and the second coil is connected to the low-pass filter side.

4 Claims, 8 Drawing Sheets

DIGITAL POWER AMPLIFIER

CROSS-REFERENCE TO RELATED APPLICATIONS

This application claims, under 35 USC 119, priority of Japanese Application No. 2002-248733 filed Aug. 28, 2002.

BACKGROUND OF THE INVENTION

1. Field of the Invention

The present invention relates to a digital power amplifier, and for example, can be applied to an audio amplifier.

2. Description of the Related Art

Recently, digitalization of power amplifiers (amplifiers) is making quick progress. Particularly, in the audio amplifiers, digitalization is remarkably adopted in full scale. As equipment equipped with the digital power amplifier (a so-called switching amplifier), there can be mentioned DVD players, minicomponents, television sets, personal computers, portable telephones and so forth.

FIG. 7 is a block diagram showing the configuration of the vicinity of a load (speaker) in a conventional switching amplifier having positive and negative two power sources.

Switching elements FET1 and FET2 including, for example, FET are connected between power supply lines +B and −B of the positive and negative two power sources of a power supply section formed of a transformer T, diodes D1 and D2, and power supply capacitors C1 and C2. A coil L and a capacitor C constituting a low-pass filter are connected between a node between the switching elements FET1 and FET2 and a node between the power supply capacitors C1 and C2, and a speaker SP as a load is connected in parallel with the capacitor C constituting the low-pass filter.

The pair of switching elements FET1 and FET2 is basically on-off controlled complementarily, corresponding to one-bit digital signal (PWM signal) obtained by converting an analog audio signal. FIG. 7 shows a state in which the switching element FET1 is switched on. By the ON action of either one of the switching elements FET1 and FET2, power supply current flows in the forward direction or the reverse direction with respect to the capacitor C constituting the low-pass filter. As a result, appropriately changed voltages across the capacitor C (voltage obtained by amplifying the initial input analog audio signal) are applied to the load SP.

Each of the both ends of the low-pass filter coil L is fed back to an analog amplifier section (not shown), which amplifies the input analog audio signal, via feedback resistances R1 and R2, to stabilize the output of the low-pass filter.

When the switching element, which has been switched on, is to be switched, through-current flows over the both switching elements, due to a difference between the transition characteristic from on to off and the transition characteristic from off to on, of the switching elements.

In order to prevent this, there is heretofore provided dead time, during which the both switching elements are switched off, by setting the timing for switching off the switching element, which has been switched on, slightly earlier than the timing for switching on the switching element, which has been switched off.

An unnecessary high pass is removed by the low-pass filter, to contemplate stabilization by the feedback function. In the case of the switching amplifier, however, there is a problem in that at the time of a high impedance load or no load, a peak occurs in the high pass in the vicinity of the cut-off frequency of the low-pass filter, as shown in the frequency characteristic diagram in FIG. 8.

Therefore, as shown in FIG. 9, it can be considered to provide a damper including a capacitor CD and a resistance RD in parallel with the low-pass filter capacitor C. However, a new problem occurs in that a power loss occurs in the damper.

Moreover, as described above, dead time is provided so that the pair of switching elements FET1 and FET2 does not switch on at the same time (so that the through-current does not flow).

However, when an MOSFET is employed as the switching element, it includes a built-in diode (body diode), and hence the reverse recovery is very slow. Therefore, when switching is carried out at a high speed, the switching element cannot be switched off instantaneously, and even if the switching element itself is switched off, reverse current flows to the built-in diode due to a carrier storage effect. As a result, through-current flows from the switching element, which is switched on, to the switching element, which should have been switched off.

As a method of preventing the through-current resulting from the delay in the operation of the built-in diode, as shown in FIG. 10, there is used a method in which high-speed diodes D3 and D4 for blocking reverse current are provided in series with the switching elements, and high-speed diodes D5 and D6 for bypassing counter-electromotive voltage are provided in parallel with the switching elements. The high-speed diodes D5 and D6 for bypassing counter-electromotive voltage form a path in which energy accumulated, when the power supply current flows, in the low-pass filter coil L flows as the current due to the counter-electromotive voltage, immediately after the switching element, which has been switched on, is switched off.

However, if the high-speed diodes D3 and D4 for blocking reverse current are provided, there is a problem in that a voltage loss occurs due to the high-speed diodes D3 and D4, thereby decreasing the efficiency.

Therefore, a digital power amplifier having high power amplifying efficiency has been heretofore desired.

SUMMARY OF THE INVENTION

In order to solve the above problems, the invention according to the first aspect is a digital power amplifier comprising at least one pair of switching sections having first and second switching elements respectively including a unipolar transistor, which form a pair inserted in series between a high potential power supply line and a low potential power supply line, in which the pair of first and second switching elements are basically caused to operate complementarily, and when switching the switching element which has been switched on, dead time during which the both switching elements are switched off is provided, to control power supply to a low-pass filter, wherein in the switching section, the first switching element, a first coil, a second coil and the second switching element are connected in series in this order, between the high potential power supply line and the low potential power supply line, the switching section comprises a first high-speed diode in which a cathode is connected to the high potential power supply line, and an anode is connected to a node between the second coil and the second switching element, and a second high-speed diode in which a cathode is connected to a node between the first switching element and the first coil, and an anode is connected to the low potential power supply line, and the node between the first coil and the second coil is connected to the low-pass filter side.

The invention according to the second aspect is a digital power amplifier comprising an analog amplifier which amplifies an input analog signal, a low-pass filter including a coil and a first capacitor, and a digital amplifier block which converts the output of the analog amplifier to a PWM signal, and controls power supply to the low-pass filter, wherein a series circuit comprising a second capacitor and a resistance is applied as a feedback circuit which feeds-back a node voltage between the coil and the first capacitor of the low-pass filter to the analog amplifier, and the series circuit has a damper function for damping a high pass peak in the frequency response characteristic of the low-pass filter, which occurs when a load is not connected to the low-pass filter, or a high impedance load is connected thereto.

DETAILED DESCRIPTION OF THE PREFERRED EMBODIMENTS

One embodiment of the digital power amplifier according to the present invention will be described in detail, with reference to the drawings.

Figure 1:
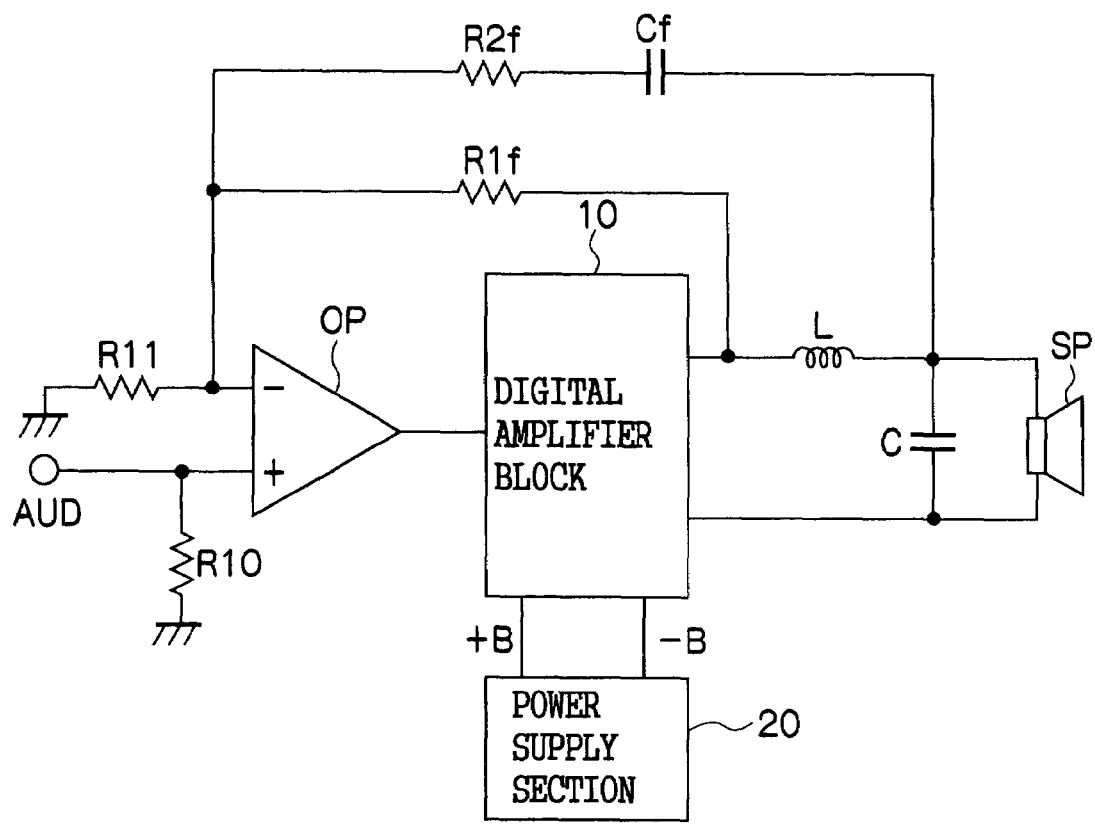
FIG. 1 is a circuit diagram showing the overall configuration of a digital power amplifier according to one embodiment.
Figure 2:
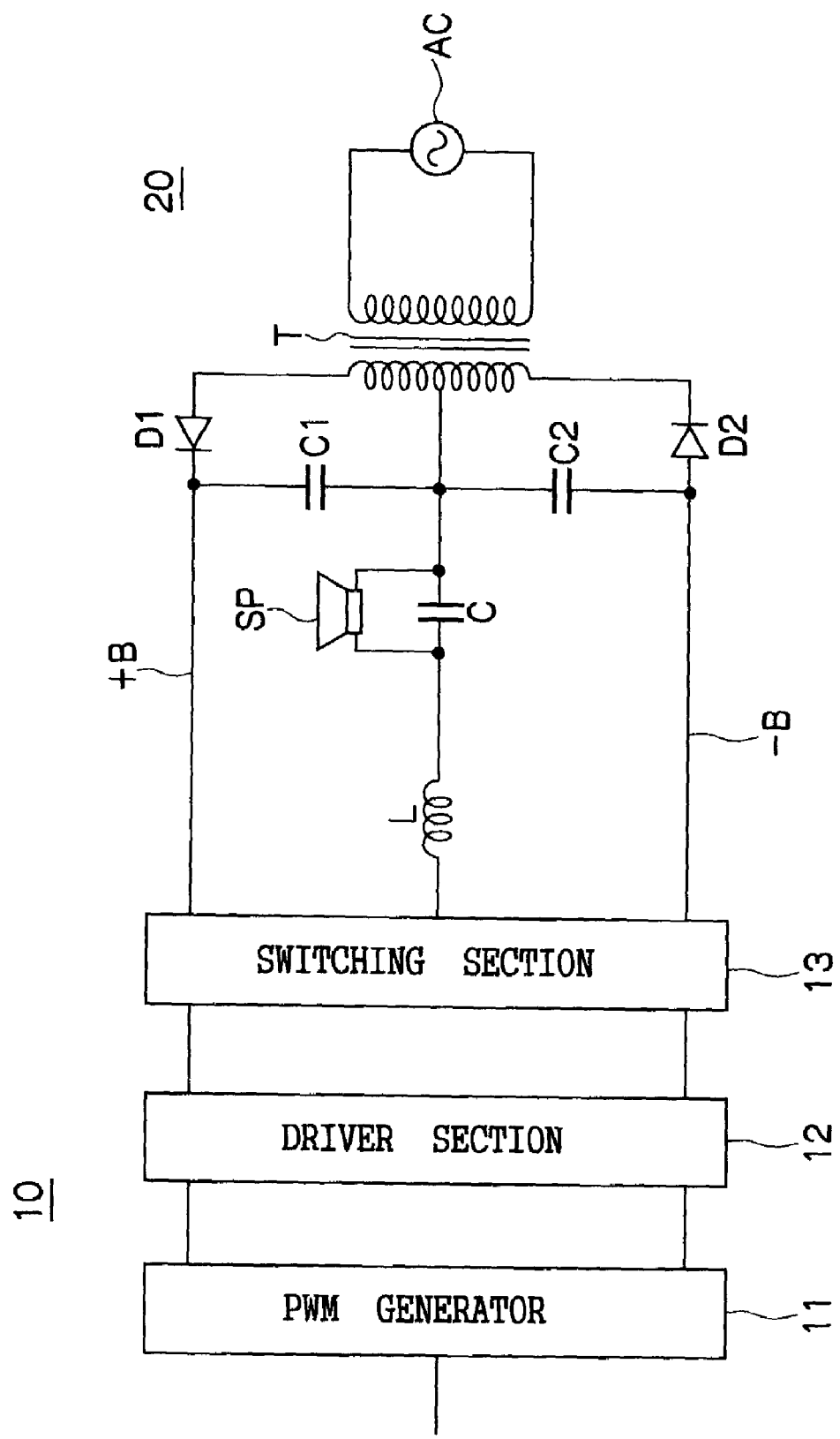
FIG. 2 is a circuit diagram showing the inner configuration of a digital amplifier block in the embodiment.

FIG. 1 is a circuit diagram including a partial block, showing the overall schematic configuration of the digital power amplifier according to this embodiment. FIG. 2 is a circuit diagram including a partial block, showing a digital amplifier block and the inner configuration of a power supply section.

In FIG. 1, a non-inverted input terminal (+) and an inverted input terminal (−) of a high-speed analog amplifier OP having the configuration of an operational amplifier are respectively grounded via a resistance R10 or R11, and an analog audio signal AUD is input to the non-inverted input terminal, which amplifies the input analog audio signal AUD and outputs the amplified signal. The inverted input terminal of the high-speed analog amplifier OP is a feedback terminal from the low-pass filter side, described later.

The amplified output signal from the high-speed analog amplifier OP is provided to a digital amplifier block 10, whose detailed configuration is shown in FIG. 2. The digital amplifier block 10 is for operating upon reception of the power supply from the power supply section 20, whose detailed configuration is shown in FIG. 2.

For example, the power supply section 20 is formed of a transformer T, diodes D1 and D2, and power supply capacitors C1 and C2, as in the conventional digital power amplifier. An alternating current power source (for example, commercial power supply) AC is applied to a primary winding of the transformer T. A secondary winding of the transformer T has a center tap. One end of the secondary winding is connected to the center tap via the anode and cathode of the diode D1 and the power supply capacitor C1. The center tap of the secondary winding is also connected to the other end of the secondary winding via the power supply capacitor C2 and the anode and the cathode of the diode D1, so that +B (positive power source) is formed in one of the power supply line, and −B (negative power source) is formed in the other power supply line.

The digital amplifier block 10 has a PWM generator 11, a driver section 12 and a switching section 13.

The PWM generator 11 comprises a triangular wave generation circuit and a comparator, for comparing the size of the output signal from the high-speed analog amplifier OP with that of the triangular wave signal generated by the built-in triangular wave generation circuit, to convert the output signal from the high-speed analog amplifier OP to a PWM signal. Here, the PWM generator 11 forms complementary PWM signals (positive-phase and negative-phase PWM signals). The positive-phase and negative-phase PWM signals are not in a complete inverted relation, taking into consideration the dead time for preventing the through-current described above.

Figure 3:
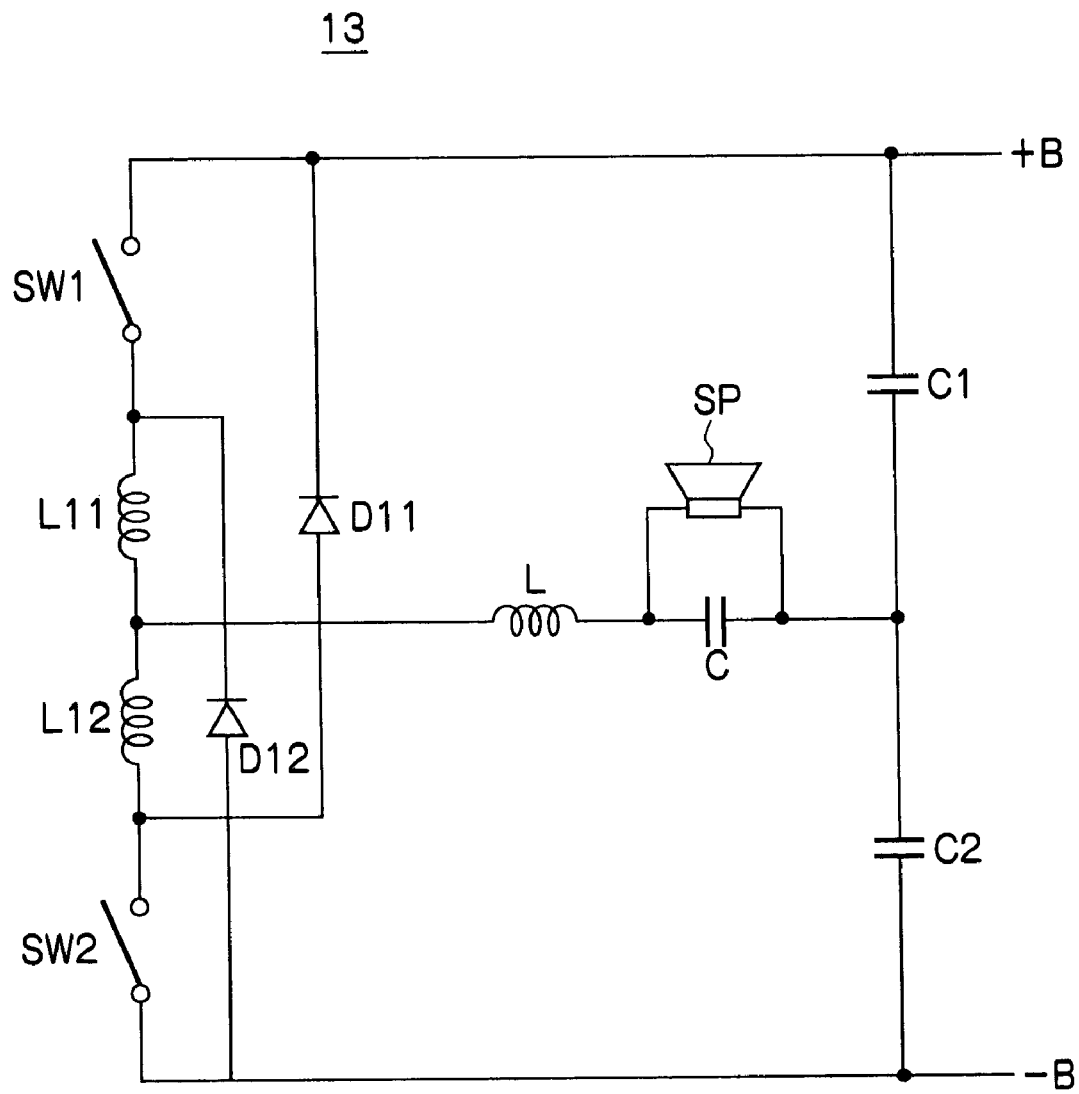
FIG. 3 is a circuit diagram showing the inner configuration of a switching section in the embodiment.

The driver section 12 is for driving the switching elements SW1 and SW2 in the switching section 13, which is shown in FIG. 3 in more detail, corresponding to the input PWM signal.

In the switching section 13, as shown in FIG. 3, the switching element SW1, a coil L11, a coil L12 and the switching element SW2 are connected in this order, between the positive power supply line +B and the negative power supply line −B. The node between the switching element SW1 and the coil L11 is connected to the cathode of the high-speed diode D12, and the anode of the high-speed diode D12 is connected to the negative side power supply line −B. The node between the coil L12 and the switching element SW2 is connected to the anode of the high-speed diode D11, and the cathode of the high-speed diode D11 is connected to the positive side power supply line +B. The node between the both coils L11 and L12 is connected to one end of a low-pass filter coil L.

One end of the low-pass filter coil L is, as shown in FIG. 1, connected to an inverted input terminal of the high-speed analog amplifier OP via a feedback resistance R1f. The other end of the low-pass filter coil L is connected to the inverted input terminal of the high-speed analog amplifier OP via a series circuit (feedback circuit) including a capacitor Cf and a resistance R2f.

For example, an MOSFET is employed for the switching elements SW1 and SW2. In this case, the both switching elements SW1 and SW2 may be the one having the same conductive type (for example, both are NMOS-FET), or the one having a CMOS configuration. For the high-speed diodes D11 and D12, for example, a schottky-barrier diode is employed, which operates at a higher speed than the built-in diode (body diode) of the switching elements SW1 and SW2.

The point in which the load (speaker) SP is connected in parallel with the low-pass filter capacitor C is the same as in the conventional configuration.

Figure 9:
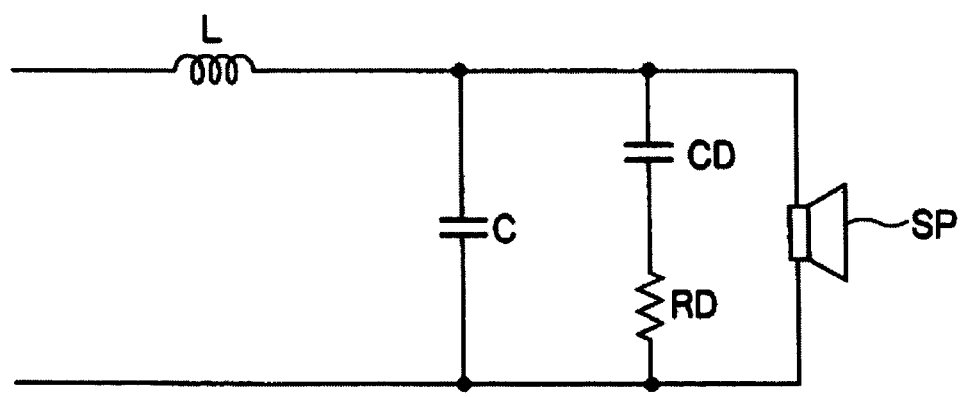
FIG. 9 is a circuit diagram showing the configuration for suppressing a high pass peak of the conventional low-pass filter.

In this embodiment, a damper in the conventional circuit as shown in FIG. 9 for suppressing the high pass peak in the vicinity of the cut-off frequency is not provided in parallel with the low-pass filter capacitor C.

The operation and function in the characteristic configuration in this embodiment will be described below. At first, the operation and function of the switching section 13 will be described.

Figure 4:
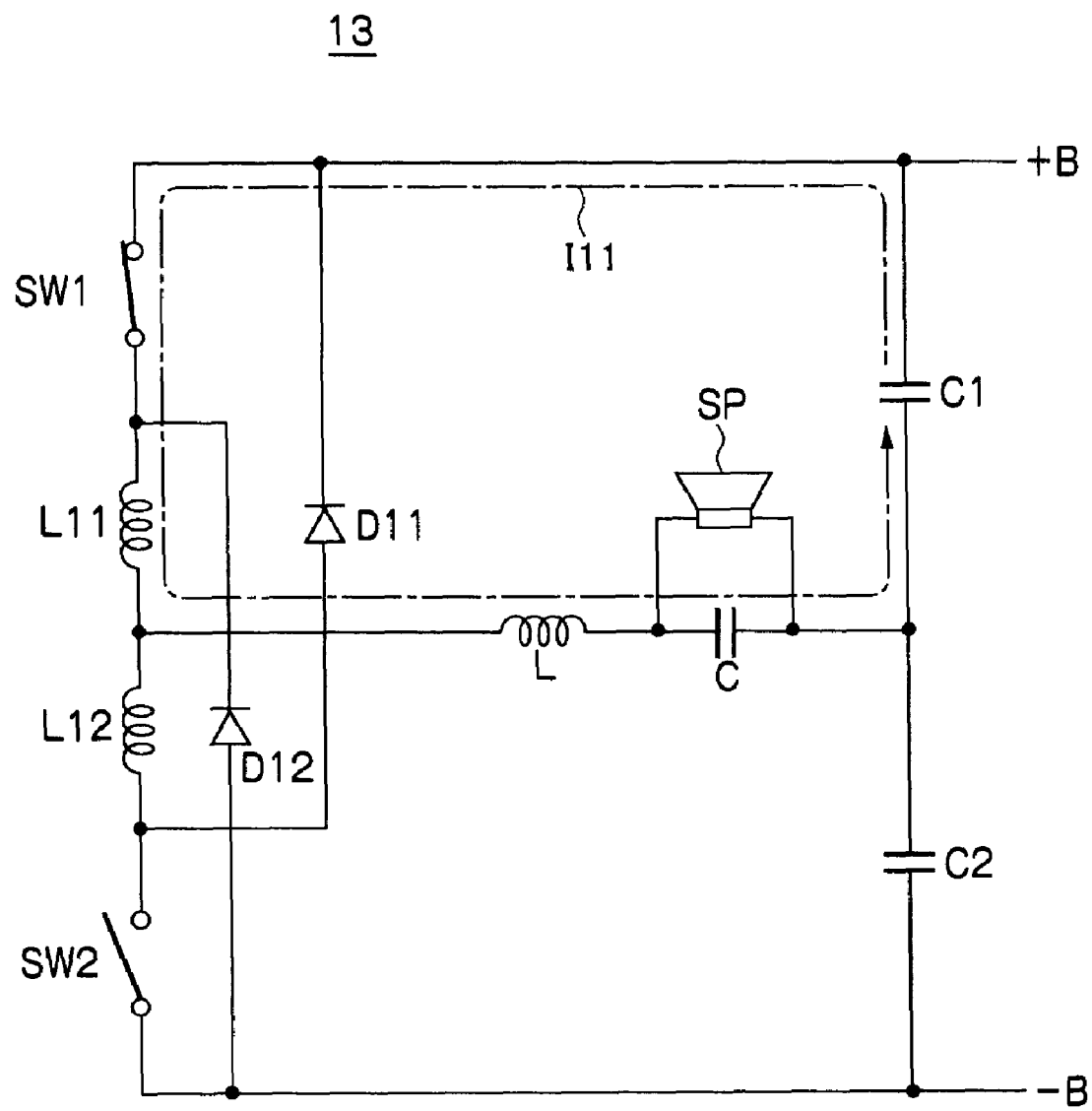
FIG. 4 is a diagram for explaining a path for power supply current in the state with only one switching element switched on in the embodiment.

As shown in FIG. 4, when only the switching element SW1 is switched on, the power supply current I11 flows, and at this time, energy is accumulated not only in the low-pass filter coil L but also in the coil L11 connected in series with the switching element SW1.

Figure 5:
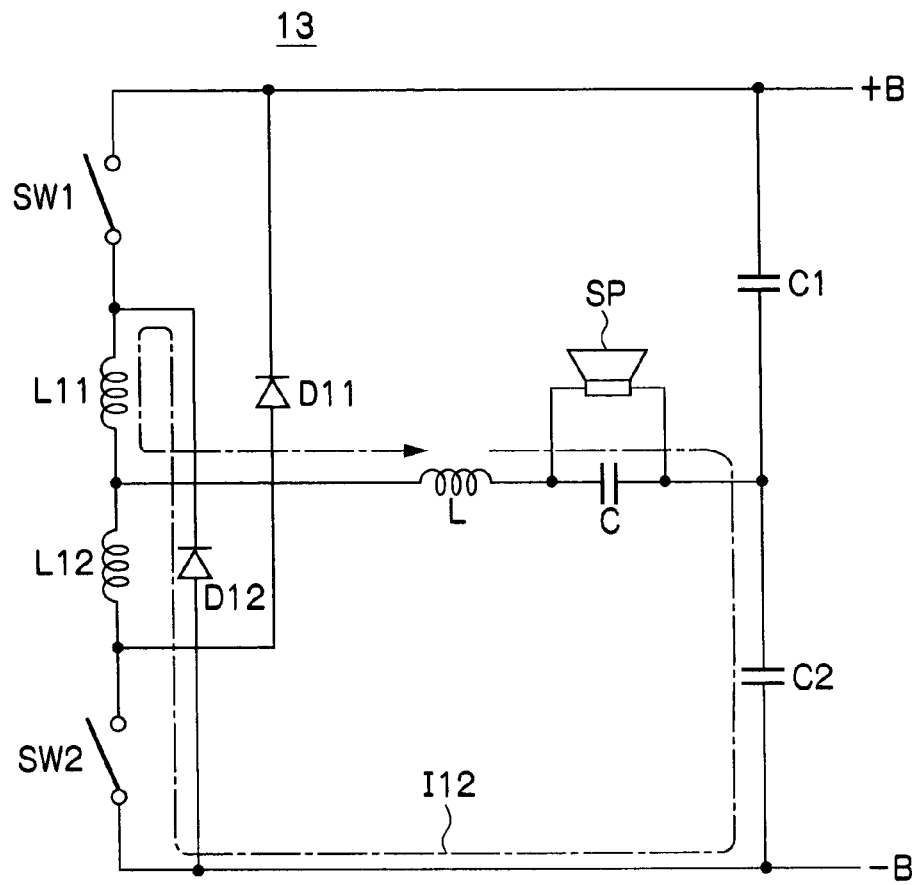
FIG. 5 is a diagram for explaining a current path due to counter-electromotive voltage of a low-pass filter coil, immediately after switching off the switching element, which has been switched on, in the embodiment.

When the switching element SW1 is switched off (the off-state of the switching element SW2 continues) by the dead time control at the time of switching the switching element which has been switched on, the accumulated energy flows as current I12 as shown in FIG. 5, due to the counter-electromotive force of the low-pass filter coil L and the coil L11. That is to say, the coil L11 attempts to flow the current due to the counter-electromotive force thereof, and draws the current due to the counter-electromotive force by the low-pass filter coil L towards the coil L11 itself. As a result, it is prevented that the current due to the counter-electromotive force by the low-pass filter coil L flows towards the switching element SW2 side (toward the built-in diode side of the switching element SW2).

Figure 10:
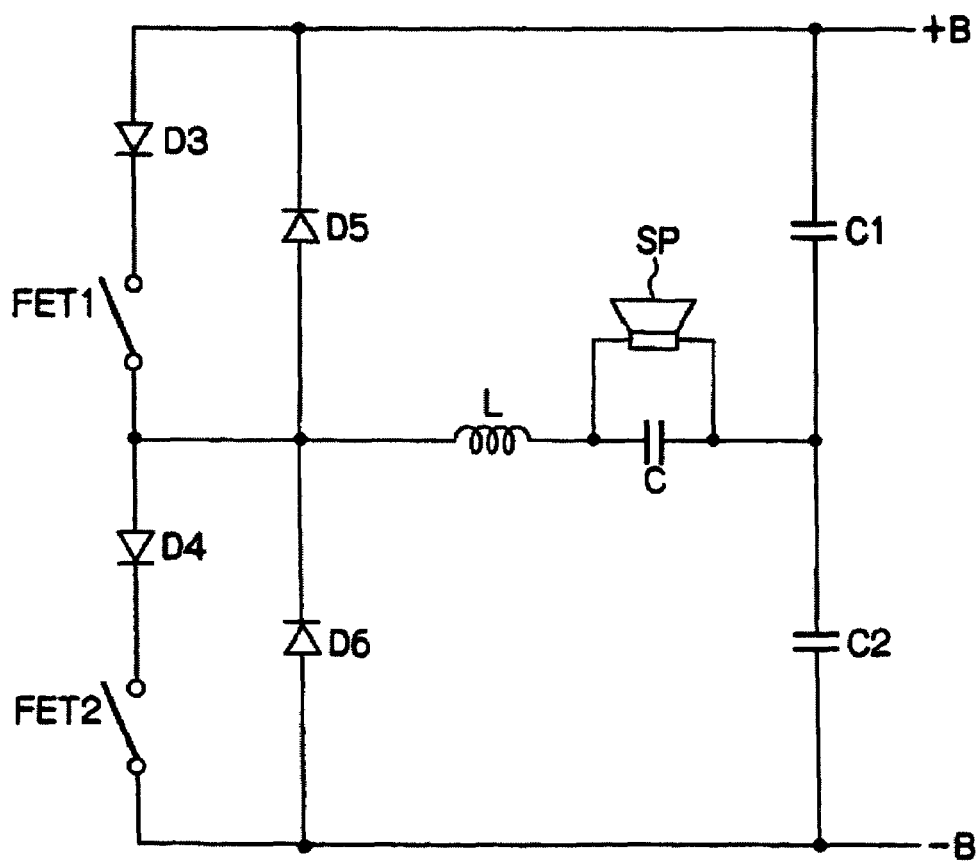
FIG. 10 is a circuit diagram showing the configuration for removing a harmful influence of the through-current due to the built-in diode in the conventional switching element.

In other words, the coil L11 exerts the reverse current preventing function similar to that of the diode D4 for preventing reverse current in the conventional circuit shown in FIG. 10.

Moreover, in the case of the reverse current blocking diode D4, a voltage loss occurs. However, in the case of the coil L11, such a loss does not occur. For the coils L11 and L12, for example, a coil having several μH is employed.

The function and operation when the series circuit including the capacitor Cf and the resistance R2f is applied as the feedback circuit from the node between the coil L and the capacitor C constituting the low-pass filter to the analog amplifier OP will be described below.

The series circuit comprising the capacitor Cf and the resistance R2f also works as the damper (CD, RD) shown in FIG. 9 in the conventional circuit. By applying the series circuit comprising the capacitor Cf and the resistance R2f as the feedback circuit, damping effect is reinforced, doubled by the loop gain. As a result, a high resistance can be used as a damping resistance, thereby enabling considerable reduction of a power loss, as compared with the conventional circuit (FIG. 9). For example, for the resistance R2f, one having several tens kΩ is employed, and for the capacitor Cf, one having 100 pF is employed.

Moreover, by employing the series circuit including the capacitor Cf and the resistance R2f as the feedback circuit, the phase in the high pass can be suppressed to 90 degrees, and the phase which delays 180 degrees at maximum in the low-pass filter can be suppressed to 90 degrees, thereby enabling suppression of oscillation.

Figure 6:
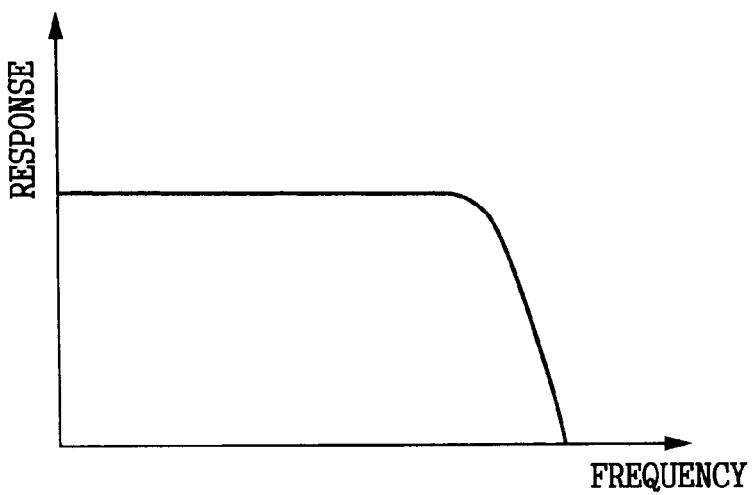
FIG. 6 is a diagram showing the frequency characteristic of the low-pass filter in the embodiment.
Figure 7:
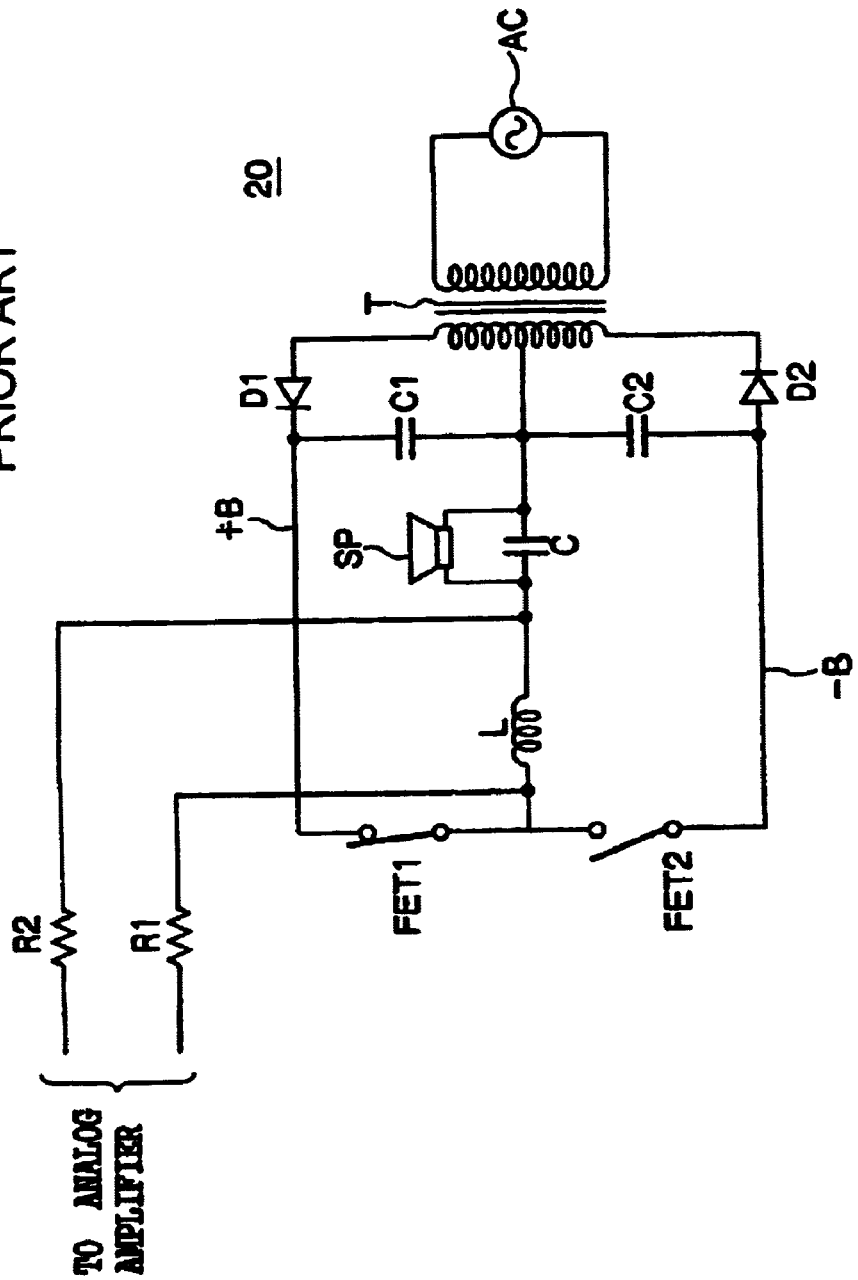
FIG. 7 is a circuit diagram showing the configuration in the vicinity of a low-pass filter and a switching section in a conventional digital power amplifier.
Figure 8:
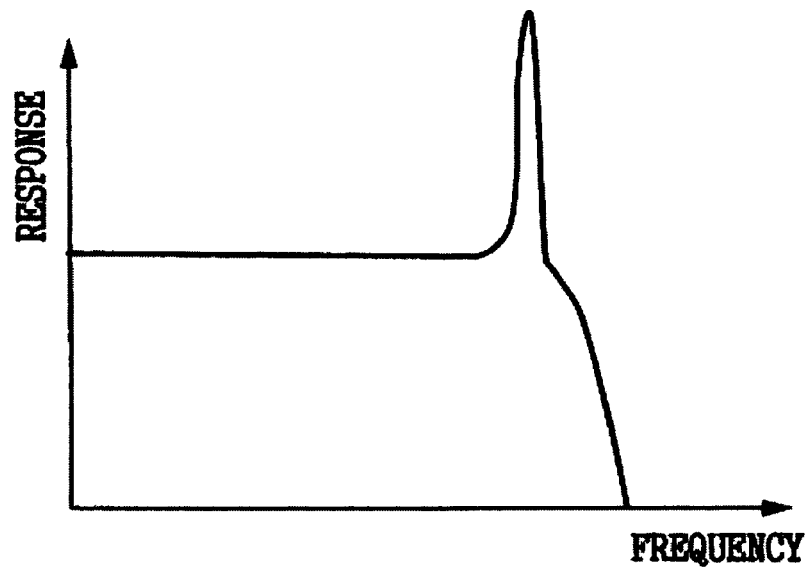
FIG. 8 is a diagram showing the frequency characteristic of the conventional low-pass filter.

FIG. 6 shows the frequency characteristic of the low-pass filter according to this embodiment, and it is seen that a peak in the high pass in the vicinity of the cut-off frequency as shown in FIG. 8 is suppressed.

As described above, according to the digital power amplifier in this embodiment, since the switching element has a built-in body diode, a voltage loss, which has heretofore occurred, can be suppressed.

Further, according to the digital power amplifier in this embodiment, since the feedback circuit has a damper function, the damper having heretofore provided in parallel with the capacitor of the low-pass filter is not required. As a result, a power loss can be suppressed as compared with a conventional circuit.

(B) Other Embodiment

In the above embodiment, explanation is given for a case where the switching element is an MOSFET. However, the present invention is also applicable to cases where other unipolar transistors (for example, MESFET or MISFET) having a built-in diode are used.

In the above embodiment, a pair of switching elements is used. However, the present invention is also applicable to a digital power amplifier including two pairs (or more) of switching elements, wherein a trouble due to the through-current by the body diode is prevented by a reverse current blocking diode connected in series with the switching element and a high-speed diode provided in parallel therewith.

In the above embodiment, explanation is given for a case where the present invention is applied to a digital power amplifier for driving a speaker, but the present invention is not limited thereto, and may be applied to an optional digital power amplifier. The effect of applying the switching section according to the present invention is large, when the load (corresponding to the entire low-pass filter and load (speaker) in the above embodiment) is an inductive load.

As described above, according to the present invention, since a point in which a loss occurs in a conventional digital power amplifier is improved, a digital power amplifier capable of performing amplification efficiently can be realized.

What is claimed is:

1. A digital power amplifier comprising:
an analog amplifier which amplifies an input analog signal;
a low-pass filter including a coil and a first capacitor;
a digital amplifier block which converts the output of said analog amplifier to a PWM signal, and controls power supply to said low-pass filter; and
a series circuit comprising a second capacitor and a resistance is applied as a feedback circuit which feeds-back a node voltage between the coil and the first capacitor of said low-pass filter to said analog amplifier, and the series circuit has a damper function for damping a high pass peak in the frequency response characteristic of said low-pass filter, which occurs when a load is not connected to said low-pass filter, or a high impedance load is connected thereto.

2. A digital power amplifier as claimed in claim 1 wherein said digital amplifier block includes:
a PWM generator; and
a switching section controlled by the PWM generator wherein the switching section has a first switching element, a first coil, a second coil and a second switching element, connected in series in this order, between a high potential power supply line and a low potential power supply line;
said first and second switching elements being unipolar transistors which operate complementarily, and when changing the states of the switching elements, dead time during which the both switching elements are switched off is provided, to control power supply to a low-pass filter;

said switching section further including a first high-speed diode in which a cathode is connected to said high potential power supply line, and an anode is connected to a node between said second coil and said second switching element, and a second high-speed diode in which a cathode is connected to a node between said first switching element and said first coil, and an anode is connected to said low potential power supply line, and the node between said first coil and said second coil being connected to said low-pass filter.

3. A digital power amplifier as claimed in claim 1 wherein said analog amplifier includes an operational amplifier having a non-inverting receiving the input analog signal and an inverting input to which the feedback circuit is connected.

4. A digital power amplifier as claimed in claim 2 wherein said analog amplifier includes an operational amplifier having a non-inverting receiving the input analog signal and an inverting input to which the feedback circuit is connected.

* * * * *

UNITED STATES PATENT AND TRADEMARK OFFICE
CERTIFICATE OF CORRECTION

PATENT NO. : 6,992,527 B2 Page 1 of 1
APPLICATION NO. : 10/646768
DATED : January 31, 2006
INVENTOR(S) : Kenji Yokoyama It is certified that error appears in the above-identified patent and that said Letters Patent is hereby corrected as shown below:

Column 8, line 5 (claim 3, line 3), after "non-inverting" insert -- input --.

Column 8, line 9 (claim 4, line 3) after "non-inverting" insert -- input --.

Signed and Sealed this

Twenty-second Day of August, 2006

JON W. DUDAS
*Director of the United States Patent and Trademark Office*